United States Patent [19]

Miller et al.

[11] Patent Number: 5,078,846
[45] Date of Patent: Jan. 7, 1992

[54] PROCESS FOR FORMING HAFNIA AND ZIRCONIA BASED PROTECTIVE FILMS ON LONGITUDINAL MAGNETIC RECORDING MEDIA

[75] Inventors: Mark S. Miller, Edina; Roger L. Peterson, Minneapolis, both of Minn.

[73] Assignee: Seagate Technology, Inc., Scotts Valley, Calif.

[21] Appl. No.: 567,072

[22] Filed: Aug. 14, 1990

[51] Int. Cl.$^5$ .............................................. C23C 14/34
[52] U.S. Cl. ............................ 204/192.2; 204/192.15; 204/192.16
[58] Field of Search ........... 204/192.15, 192.2, 192.22, 204/192.16

[56] References Cited

U.S. PATENT DOCUMENTS

| | | | |
|---|---|---|---|
| 4,515,668 | 5/1985 | Brownell et al. | 204/192.2 |
| 4,789,598 | 12/1988 | Howard et al. | 204/192.16 X |
| 4,824,539 | 4/1989 | Komoda et al. | 204/192.2 |
| 4,898,774 | 2/1990 | Yamashita et al. | 204/192.2 X |
| 4,929,500 | 5/1990 | Yamashita et al. | 204/192.1 X |
| 4,957,604 | 9/1990 | Steininger | 204/192.2 X |

FOREIGN PATENT DOCUMENTS

0240088A2  10/1987  European Pat. Off. .

OTHER PUBLICATIONS

"Sputtered ZrO$_2$ Overcoat with Superior Corrosion Protection and Mechanical Performance in Thin Film Rigid Disk Application", Yamashita et al.
"Friction and Wear of Partially Stabilized Zirconia: Basic Science and Practical Applications", Hannink et al, *Wear*, 100 (1984) 355-366.

Primary Examiner—Nam X. Nguyen
Attorney, Agent, or Firm—Frederick W. Niebuhr; Edward P. Heller, III

[57] ABSTRACT

A process is disclosed for forming magnetic media, in which a protective overcoat of either partially stabilized zirconia or partially stabilized hafnia directly overlies a magnetic thin film recording layer. First, a chromium underlayer is sputter deposited onto a planar aluminum nickel phosphorous substrate. A crystalline magnetic recording layer is deposited onto the chromium underlayer, and substantially replicates the crystalline orientation of the underlayer. The substrate, underlayer and recording layer are passivated briefly in an oxygen atmosphere. Then, the hafnia or zirconia underlayer is applied by RF reactive sputtering in an atmosphere of argon and oxygen, with the argon partial pressure at least ten times the oxygen partial pressure. The passivation step improves the adhesion of the subsequently deposited cover layer, while the oxygen in the reactive sputtering process maintains a desired stoichiometric proportion of oxygen in the cover layer, for substantially improved media tribological properties.

29 Claims, 2 Drawing Sheets

PROCESS FOR FORMING HAFNIA AND ZIRCONIA BASED PROTECTIVE FILMS ON LONGITUDINAL MAGNETIC RECORDING MEDIA

BACKGROUND OF THE INVENTION

The present invention relates to magnetic thin film media for longitudinal recording, and more particularly to protective overlayers applied to the magnetic thin films of such media.

Magnetic recording involves magnetic disks typically housed within disk drives and rotated on an axis, with data transducing heads positioned at close proximity to the recording surfaces of the disks and moved generally radially with respect to the disks. Generally the disks are of two kinds: flexible or "floppy" disks in contact with associated transducing heads at all times; and rigid disks. Rigid disks are rotated at much higher speeds than the flexible disks. Consequently the transducing heads, during reading and recording operations, are maintained at a controlled distance from the disk recording surfaces, supported on a "bearing" of air as the disks rotate. Such transducing heads contact their associated rigid disks only when the disks are stationary, when they accelerate from a stop, or when they decelerate just before coming to a complete stop.

As compared to flexible disks, rigid disks and drives are subject to stricter design tolerances, arising from the greater density of data stored on disk recording surfaces. It is considered desirable during reading and recording operations to maintain each transducing head as close to its associated recording surface as possible, i.e. to minimize the "flying" height of the head. A reduction in flying height improves signal to noise ratio, enhancing the speed and accuracy of reading and recording operations, and increasing the density at which data can be stored.

The utility of protective cover layers in magnetic recording media is well known. Materials employed as magnetic thin films, typically magnetic alloys such as cobalt-nickel, cobalt-chromium-tantalum, cobalt-chromium-platinum, cobalt-nickel-platinum, cobalt-nickel-chromium, and cobalt chromium among others, are susceptible to corrosion, particularly in relatively humid environments. Moisture in the air reacts with exposed surface areas of the media, degrading or destroying the capability of the material to be magnetized at corrosion sites. This diminishes the capacity of the magnetic medium to store data, and gives rise to the desire to protect the magnetic thin film against exposure to moisture. While corrosion protection of the magnetic alloy is required of the overcoat, the tribological or wear properties of the overcoat are of primary concern. Even in the case of rigid disks, there is a substantial amount of surface contact between the disks and transducing heads. The overcoat must maintain its surface integrity and interact with the transducing head in a manner to minimize wear or damage to the transducing head.

In connection with rigid disk media, the traditional approach to meeting this need is to apply a film or overcoat of a hard, amorphous carbon. Carbon coatings, however, tend to develop pin holes that expose the magnetic recording film to corrosion. Particulates formed at corrosion sites can interfere with the reading and writing of data, and can eventually cause a data transducing head to crash. Corrosion sites frequently are slightly raised, and cause aerodynamic instability in the air bearing which supports the transducing head relative to its associated recording surface. Resulting fluctuations in the head can lead to a head crash, particularly at low flying heights. Carbon films also are susceptible to local microscopic heating due to head contact friction. Locally intense heat converts carbon from the SP-3 phase to the SP-2 phase, a transformation that can lead to sublimation of the carbon overcoat, and subsequently increased wear.

Recent designs for rigid disk drives also contemplate disk rotation at speeds up to 5,000 revolutions per minute, as compared to the 1,800 rpm in conventional drives. The result is a need for improved tribological qualities in the protective overcoat, due to the higher speeds themselves, and also due to the fact that higher disk rotational speeds result in the transducing head contacting the disk, particularly the overcoat, for longer periods of time. Carbon overcoats wear rapidly at speeds approaching 5,000 rpm, due to such increased contact with the transducing head during acceleration and deceleration of the disk. Such wear eventually can expose the underlying magnetic layer.

Frequently, liquid lubricants have been applied to improve tribological characteristics of carbon and silicon coatings, and do improve both friction and wear characteristics. Lubricant layers are increasingly subject to wear or spin-off at higher rotational speeds, eventually exposing the carbon layer beneath the lubricant. Chromium underlayers have been applied immediately beneath carbon coatings in an attempt to resist corrosion of the carbon layers. While this technique has successfully increased resistance to corrosion, the combined layer thickness reduces signal amplitude to the head.

In view of the deficiencies in carbon overcoats, alternative cover layer materials have been explored. For example, European Patent Application No. 87200616.8 (Yamashita) discloses a variety of protective coatings based on zirconium, including zirconium oxide (zirconia), zirconium boride, zirconium carbide and zirconium nitride. The coatings are deposited by sputtering, and preferably include a stabilizer such as yttrium oxide ($Y_2O_3$), calcium oxide or magnesium oxide. Yamashita teaches that an intermediate layer enhances control of the reliability of the magnetic disk, stating that a zirconia film formed directly onto magnetic media may blister and peel due to stress at the bond between the cover layer and medium, caused by friction from contact with the transducing head. This failure was reported as observed after just one hundred CSS (contact start stop) test cycles. An intermediate layer of chromium, zirconium, hafnium, titanium, tantalum or tungsten, or an alloy of these materials, is said to reduce this problem. Of course, it also adds to the thickness of the material covering the magnetic thin film recording medium.

Therefore, it is an object of the present invention to provide a magnetic recording medium in which a zirconia or hafnia based cover layer is applied directly to a magnetic thin film recording layer, with minimal degradation of the cover layer tribology, even after thousands of CSS cycles.

Another object is to provide a process for manufacturing a magnetic recording medium, in which a protective overlayer is applied directly to a magnetic thin film layer in a reactive sputtering process favorable to forming zirconia or hafnia upon the thin film, thus to enhance the quality of the overcoat.

Yet another object is to provide a method of treating a magnetic thin film recording layer of a recording medium, just prior to forming a protective cover layer onto the magnetic film, to enhance adhesion of the cover layer to the film for improved performance and longer life of the resulting recording medium.

SUMMARY OF THE INVENTION

To achieve these and other objects, there is provided a process for manufacturing a magnetic recording medium, including the following steps:

depositing a crystalline underlayer onto a substantially planar surface of a substrate;

depositing a crystalline recording layer comprised of magnetic recording material onto the crystalline underlayer;

passivating the magnetic recording layer interface in an oxygen atmosphere; and following passivation, enclosing the substrate, underlayer and magnetic recording layer, along with a target formed of a cover layer material, within a vacuum deposition chamber in a substantially inert gas atmosphere at a pressure in the range of from about 1 millitorr to about 10 millitorr, and sputter depositing a cover layer onto the magnetic recording layer, to a thickness within the range of from about 250 angstroms to about 350 angstroms, with the cover layer consisting essentially of one or both of the following constituents: partially stabilized zirconia, and partially stabilized hafnia.

The preferred target material consists essentially of from 85 to 98 percent of either hafnia or zirconia, and from 2 to 15 percent a stabilizer, with the stabilizer consisting essentially of rare earth oxide, e.g. yttrium oxide.

The preferred manner of applying the protective cover layer is by RF reactive sputtering, in an atmosphere of gases such as argon and oxygen. A negative RF bias is applied to the stabilized hafnia or zirconia target, which causes positively charged argon atoms to be accelerated towards the target. The accelerated ions and neutral particles sputter the stabilized hafnia or zirconia onto a substrate placed near the target. Typical stoichiometry of the sputtered overcoat is from two to fifteen percent stabilizer and from eighty-five to ninety-eight percent hafnia or zirconia.

RF magnetron, ion beam or reactive sputtering from a metallic zirconium, hafnium, stabilized zirconia or hafnia target may also be employed to deposit the overcoat. Typical oxygen partial pressures will range from $0.3 \times 10^{-4}$ to $1.0 \times 10^{-3}$ torr, although preferably at most $0.10 \times 10^{-3}$ torr, depending on the technique and apparatus employed. Oxygen pressures that are too high reduce overcoat density, thereby degrading tribological results. Argon pressures of 10 millitorr or less are also employed, to minimize the amount of void content present in the sputtered film. Highly voided hafnia or zirconia overcoats have been found to demonstrate poor tribological properties, leading to head crashes.

The process may also include the application of a negative bias in the range of from 50 to 250 volts to the substrate. Biasing of the substrate reduces grain size and improves film packing density, for a better wearing cover layer.

In the passivation step, the substrate, underlayer and recording layer are maintained in an oxygen atmosphere at a pressure in the range of from about $5 \times 10^{-2}$ millitorr to about 1 millitorr, with the preferred oxygen pressure being about 0.1 to 0.3 millitorr. The time of passivation is approximately 1 to 5 minutes, with a preferred time being about 2 minutes, although this may vary based on the nature of the vacuum deposition chamber, the magnetic thin film layer material, and the protective overcoat material to be applied.

The preferred thickness of the protective layer, whether partially stabilized zirconia or hafnia is about 300 angstroms. No intermediate, adhesion enhancing layer is required between the thin film and cover layer. Consequently the separation of the transducing head from the thin film layer during reading and recording operations is reduced, without reducing in the flying height, for improved performance and data storage density in the recording medium. Tribological properties remain excellent after thousands of CSS cycles, with both static and kinetic (dynamic) friction coefficients remaining below 1, and with the application of a fluorocarbon lubricant reducing these coefficients to below 0.5.

IN THE DRAWINGS

Other features and advantages of the invention will become apparent upon consideration of the following detailed description and upon reference to the drawings, in which.

Figure 4:
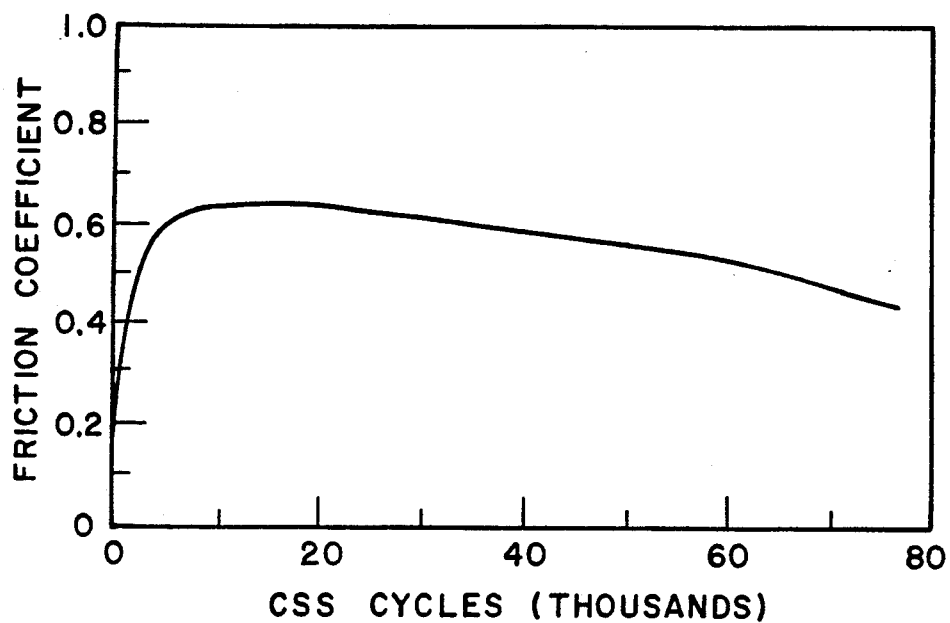
Figure 5:
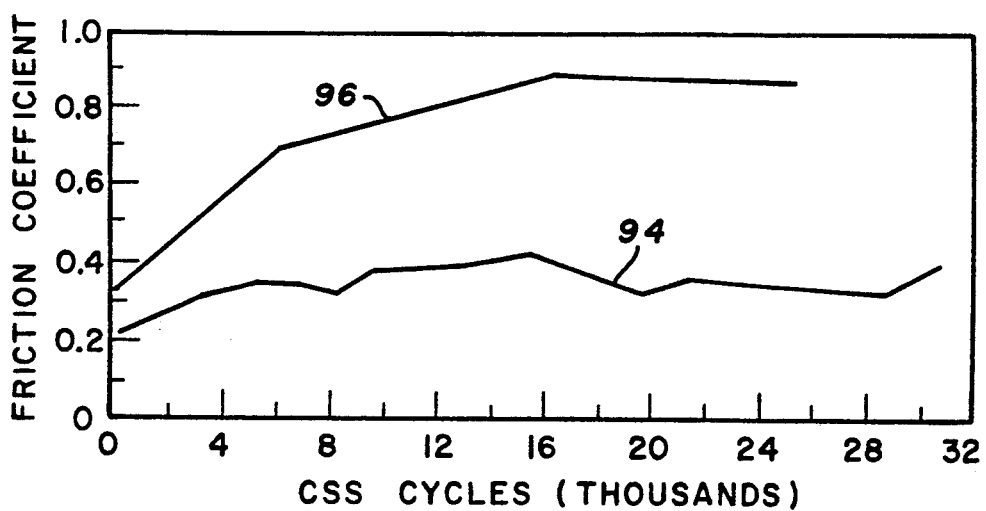

FIG. 4 is a chart illustrating the change in 1 rpm coefficient of friction, over a range of CSS test cycles for a recording medium including a partially stabilized hafnia overlayer, formed in accordance with the present invention; and FIG. 5 is a chart illustrating comparative coefficients of friction over a range of CSS cycles, for lubricated and unlubricated partially stabilized zirconia cover layers applied directly over a chromium underlayer.

DETAILED DESCRIPTION OF PREFERRED EMBODIMENTS

Figure 1:
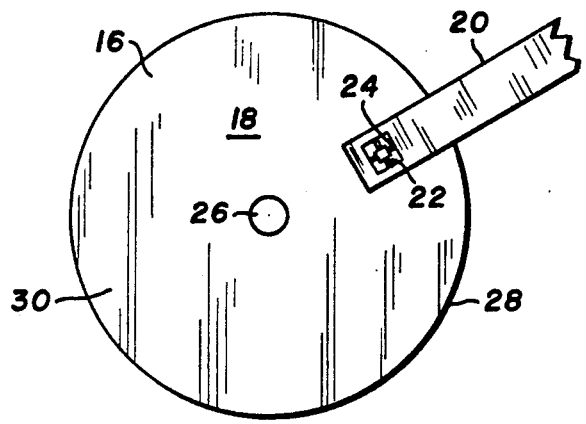
FIG. 1 is a plan view of a rotatable rigid magnetic recording disk formed according to the present invention, and a transducing head supported generally for movement radially of the disk.
Figure 2:
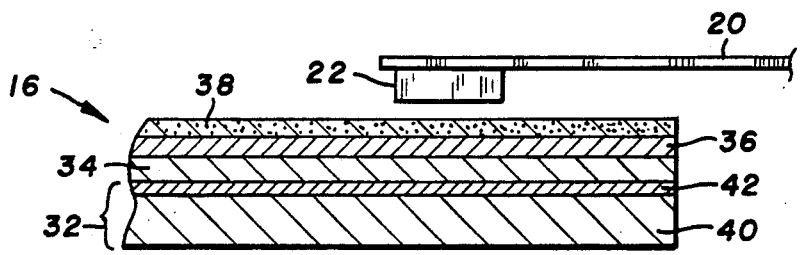
FIG. 2 is an enlarged partial sectional view of the magnetic disk of FIG. 1.

Turning now to the drawings, there is shown in FIGS. 1 and 2 a data recording medium, in particular a rigid magnetic disk 16 rotatable about a vertical axis and having a substantially planar and horizontal upper surface 18. A transducing head support arm 20 is part of a carriage assembly supported for linear reciprocation radially of disk 16. A magnetic transducing head or slider 22 is supported by arm 20 through a head suspension 24, for movement relative to the disk along with the arm. Suspension 24 allows for gimballing action of the head, i.e. limited vertical travel and limited rotation about pitch and roll axes.

At the center of disk 16 is an opening 26 to accommodate a vertical spindle of a disk drive (not shown) used to rotate the disk about the vertical axis. Between opening 26 and an outer circumferential edge 28 of the disk, a plurality of a circular tracks of data, and perhaps servo information, are provided in a data storage region or area 30.

As seen from FIG. 2, disk 16 is formed of a plurality of layers including a substrate 32, an underlayer 34, a magnetic thin film recording layer 36, and a protective cover layer 38 over the thin film. More particularly, disk 16 is formed first by polishing, grinding or otherwise machining an aluminum substrate disk 40 to provide a substantially flat upper surface of the substrate. Next, a nickel-phosphorous (Ni-P) alloy 42 is plated onto the upper surface of the aluminum disk, to provide a substantially uniform layer having a thickness of preferably about 10 microns, and within a range of from 5 to 20 microns. Following plating, alloy layer 42 is polished to a roughness of generally less than 0.1 microinch, for example by a silicon carbide grit lapping process. This normally is accomplished with a cloth or paper carrying the grit, and also can involve a liquid slurry containing grit in combination with a cloth or paper if desired. Such processes are known and not further discussed here.

Figure 3:
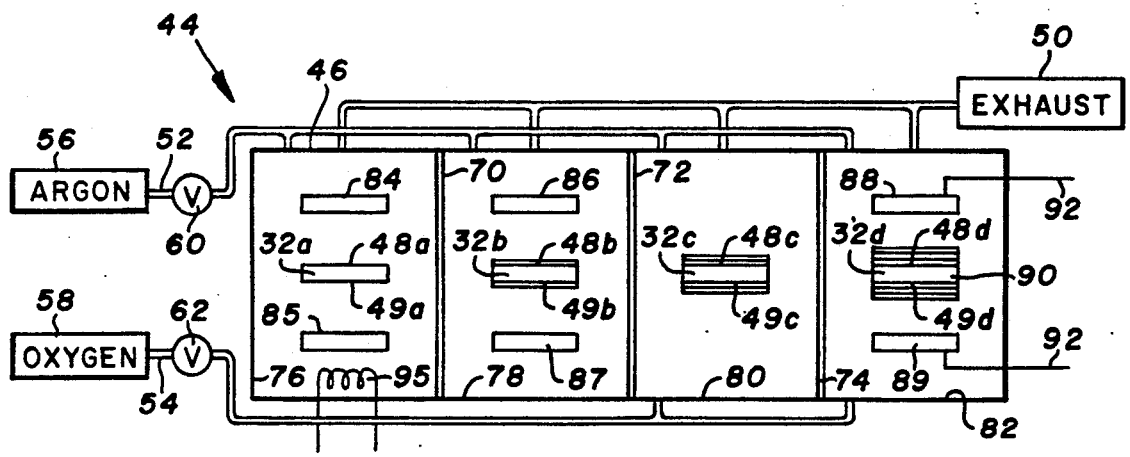
FIG. 3 is a schematic view of a vacuum deposition apparatus utilized in forming the disk of FIG. 1.

Following polishing, the remaining layers illustrated in FIG. 2 are applied, preferably by vacuum sputter deposition. An example of an apparatus suitable for deposition is schematically illustrated at 44 in FIG. 3. The apparatus includes a fluid tight sputtering or plasma chamber 46 in which a plurality of substrates 32a–32d are enclosed, with respective upward and downward facing surfaces 48a–48d and 49a–d. The apparatus further includes an exhaust pump 50 in fluid communication with chamber 46 for evacuating the chamber when desired. Also in fluid communication with the chamber, through lines 52 and 54 respectively, are a container 56 for supplying an inert gas such as argon, and a container 58 for supplying oxygen to the chamber. Each of a pair of valves 60 and 62 controls the supply of its associated gas to plasma chamber 46.

Partitions at 70, 72 and 74 divide plasma chamber 46 into four separate subchambers indicated at 76, 78, 80 and 82. In subchamber 76, chromium targets 84 and 85 are electrically connected as cathodes and positioned in spaced apart relation to substrate 32a, facing surface 48a and 49a of the substrate, respectively. In subchamber 78, targets 86 and 87 of an appropriate magnetic alloy, e.g. cobalt-chromium-tantalum, are positioned spaced apart from and facing the Cr layers covering surfaces 48b and 49b of substrate 32b. The most rightward 11 subchamber 82 contains a pair of targets 88 and 89 formed of an overcoat material, preferably either partially stabilized zirconia or partially stabilized hafnia. Preferably, each of the targets/cathodes is parallel to the surface 48 or 49 of its corresponding substrate. A means 95 is provided in chamber 76 for preheating substrate 32.

Thus, plasma chamber 46 is used to apply underlayer 34, magnetic thin film layer 36, and protective cover layer 38 to each of the substrates. This permits application of the chromium underlayer and the magnetic alloy layer without any intervening exposure to reactive gases, thereby preventing oxidation of the underlayer and the magnetic alloy. The partitions prevent cross contamination, to enable application of all necessary layers in a single chamber.

In order to apply chromium underlayer 34 to substrate 32, exhaust pump 50 is actuated to substantially evacuate plasma chamber 46. Following evacuation, valve 60 is opened to supply argon to subchamber 76, until pressure within the subchamber reaches a predetermined value, for example from $10^{-5}$ to $10^{-3}$ torr, or preferably $5 \times 10^{-4}$ torr for DC magnetron sputtering. The substrate is preferably preheated to a temperature in the range of from 100° to 230° C., but most preferably 200° C. Preheating of the substrate in the range of 120°–250° C. improves the crystallographic orientation and density of the various layers. Power at a desired level, for example 5 watts per square centimeter, is supplied to cathodes 84 and 85 to generate an electrical field and ionize the argon, forming an argon plasma within the chamber. The electrical field accelerates the argo ions onto the chromium targets 84 and 85, until a sufficient number of chromium atoms have sputtered onto the substrate 32a to form the chromium underlayer to its desired thickness. The underlayer is formed with a substantially uniform thickness preferably of about 2,000 angstroms, and within a range of from 200 to 3,000 angstroms.

Chromium layer 34 is crystalline in nature and predetermines the orientation of the subsequently applied crystalline magnetic thin film. In particular, the crystallographic orientation of the chromium layer is substantially uniform, and controls the orientation of the magnetic alloy crystals epitaxially grown upon the underlayer such that axes of easy magnetization of the crystals comprising the thin film recording layer are substantially aligned in a plane parallel to the substrate surface, a feature desired in longitudinal magnetic thin film recording.

Following deposition of underlayer 34, the substrate and underlayer are transferred from subchamber 76 into subchamber 78. Argon pressure is held at the same level as in subchamber 76, or adjusted as appropriate if thin film layer 36 is to be sputtered at a different argon pressure than underlayer 34. Targets 86 and 87 are biased to generate the required electrical field once again. In subchamber 78, argon ions are accelerated by the electrical field onto targets 86 and 87. The accelerated argon ions, and neutral argon atoms, sputter the target material onto the chromium underlayer. Vacuum deposition, again preferably DC magnetron sputtering, proceeds until the magnetic thin film recording layer has been applied to a preferred thickness of 700 angstroms, or a thickness within the range of 250 to 1,000 angstroms. Along with previously mentioned cobalt chromium tantalum, other materials suitable for the magnetic thin film include cobalt chromium, cobalt platinum chromium, cobalt nickel, cobalt nickel platinum, cobalt phosphorous, cobalt nickel phosphorous, and cobalt nickel chromium.

Following deposition of the magnetic thin film, the substrate, underlayer and film are placed within subchamber 80 for passivation of the exposed surfaces of the magnetic layers in an oxygen atmosphere. In preparation for this step, subchamber 80 is evacuated by exhaust pump 50, after which valve 62 is opened to admit oxygen into the subchamber, to a pressure in the range of from 0.05 to 1.0 millitorr, and more preferably at about 0.1 millitorr. The required time for passivation is relatively brief, preferably about 1 minute or within a range of from 0.5 to 5 minutes. Passivation enhances adhesion of the protective cover layer 38 to magnetic thin film layer 36, for improved wear and friction properties to disk 16 without an intermediate adhesion layer between the cover layer and thin film.

Following passivation, the substrate, underlayer and thin film are transferred to subchamber 82 for deposition of protective cover layer 38. In preparation for this step, exhaust pump 50 is used to evacuate subchamber 82, then valves 60 and 62 are opened to provide a mixture of argon and oxygen, although primarily argon. More particularly, argon is provided to a pressure in the range of from 0.5 to 1.5 pascal (about 3.5 to 10 millitorr), while the background pressure of oxygen is preferably at most 0.02 pascal (0.15 millitorr), but within a range of about 0.01 to 0.04 pascal (0.08 to 0.3 millitorr). The background pressure of argon is preferably at least an order of magnitude greater than the oxygen pressure.

As previously mentioned, the preferred materials for target 88 include partially stabilized zirconia and partially stabilized hafnia. A particularly preferred target structure for cathodes 88 and 89 includes either zirconium oxide or hafnium oxide at 90 percent by weight, with the balance a stabilizer. A permitted range for the hafnia or zirconia is 85 to 98 percent, along with a 2 percent to 15 percent range for the stabilizer, which preferably is yttrium oxide ($Y_2O_3$), calcium oxide (CaO) or magnesium oxide (MgO).

Preferably, sputtering is by an RF reactive process, either RF diode sputtering or RF magnetron sputtering. The partial pressure of oxygen counteracts the tendency of the sputtered hafnia or zirconia molecules to break down into their metallic and oxygen components, and maintains the oxygen stoichiometry in the sputtered thin film layer.

During RF reactive sputtering, a negative RF bias of 250 to 1,000 volts is applied to targets 88 and 89 via a line 92, and a negative RF bias of 50 to 200 volts may be applied to the substrates through a line 90. The bias applied to the substrate reduces grain size and contamination, and thus improves the wear capabilities of the cover layer. Application of the negative bias to target 88 tends to accelerate positive ions moving toward the target, thereby sputtering the partially stabilized zirconia or hafnia from the target. The RF reactive sputtering continues until cover layer 38 has a substantially uniform thickness within the range of 250 to 350 angstroms, and more preferably about 300 angstroms.

If desired, oxygen passivation and application of cover layer 38 can be accomplished in the same chamber, so long as oxygen is evacuated to a sufficiently low partial pressure. The magnetic thin film recording layer should be applied in a separate chamber, however, as even slight oxygen contamination could substantially degrade the magnetic recording layer.

At this point substrate 32, with the underlayer, magnetic layer and cover layer applied, is removed from plasma chamber 46. If desired, a liquid lubricant can be applied to the disk in a known manner, e.g. by spin application. One of the features of the present invention, however, is that such liquid lubricant coating is not required.

The coating adheres to thin film magnetic recording layer 38, and produces a long wearing surface having favorable static and kinetic friction coefficients. The chart of FIG. 4 relates to test results from sample media coated with partially stabilized hafnia. The hafnia was applied to a thickness of 350 angstroms, applied at about 4 millitorr argon pressure, $1.5 \times 10^{-4}$ oxygen pressure and at a bias of 4 watts per square centimeter. No liquid lubricant was applied to the sample media. The average coefficient of 1 rpm friction reached a peak of about 0.65 after 20,000 CSS cycles, then exhibited a gradual decrease to approximately 0.5 after about 76,000 CSS cycles. Friction coefficients were found, based on a load of 9.5 grams applied to an aluminum oxide-titanium carbide composite slider in contact with the disks. Thus, extremely favorable friction and wear characteristics were achieved. Maximum (as opposed to average) values for the coefficient remained below 1.0.

The favorable friction coefficients shown in the chart in FIG. 4 are achieved in the absence of any lubricant. As seen from FIG. 5, application of a fluorocarbon liquid lubricant to a partially stabilized zirconia overcoat further reduces the coefficient of friction.

In accordance with the present invention, improved recording media employing partially stabilized zirconia or partially stabilized hafnia protective overcoats, exhibit excellent friction and wear characteristics as well as providing the required corrosion protection for the magnetic thin film. Deposition of the overcoats at relatively low argon pressures, provision of a controlled oxygen background pressure during deposition, and oxygen passivation just prior to depositing the overcoat, all contribute to substantially improved media performance. This is readily apparent from tests performed on exemplary samples which demonstrate the enhanced mechanical properties of overcoats applied in accordance with the present invention.

In particular, yttria ($Y_2O_3$) stabilized zirconia ($ZiO_2$) was RF diode sputtered over a 2,000–3,000 angstrom thick chromium underlayer, which had been previously applied to an aluminum/nickel/phosphorous substrate as previously described. In all cases the sputtering target included about ten atomic percent of the yttria stabilizer. The cover layer was sputtered to a thickness in the range of 300 to 350 angstroms. RF diode target input power, for applying the chromium underlayer as well as the overcoat, was 3.6 watts per square centimeter. Substrate temperature was maintained at 120° C. The test samples were prepared without magnetic recording layers.

Other conditions were selectively varied, including the argon pressure during sputtering, the oxygen pressure, and the use of oxygen to passivate the chromium underlayer just prior to zirconia deposition. These differences are illustrated in the following examples, each of which is based on the testing of from two to four samples.

EXAMPLE I

The argon pressure was 0.5 Pa (3.8 millitorr), the background pressure of oxygen was 0.04 Pa (0.3 millitorr), and a bias was applied to the target but not to the substrate during sputtering.

EXAMPLE II

Argon pressure was 0.5 Pa, the oxygen pressure was 0.02 Pa 0.15 millitorr), and a bias was applied only to the target.

EXAMPLE III

The argon pressure was 0.5 Pa, the oxygen pressure was 0.01 Pa (0.75 millitorr), and a bias was applied only to the target.

EXAMPLE IV

The argon pressure was 0.5 Pa and sputtering occurred in the absence of oxygen, with bias applied only to the target.

EXAMPLE V

The argon pressure was 2.0 Pa (15 millitorr), the pressure of oxygen was 0.01 Pa, and a bias was applied only to the target.

EXAMPLE VI

The argon pressure was 2.0 Pa, the oxygen pressure was 0.04 Pa, and a bias was applied to the target and to the substrate.

EXAMPLE VII

The argon pressure was 2.0 Pa, the oxygen pressure was 0.02 Pa, and a bias was applied to the target and substrate.

The test samples were subjected to friction measurement using strain gauges mounted on a transducing head slider supporting arm, with the slider being a composite of alumina and titanium carbide. Throughout CSS testing, friction measurements were taken at one revolution per minute. The acceleration time to 3,600 rpm was four seconds, and time for deceleration to stop was eight seconds. The slider flying height was approximately 250 nm.

The partially stabilized zirconia overcoats were analyzed for film porosity and grain size distribution, using a TEM (transverse electron microscope), with the TEM voltage at 100 kilovolts. The results, by example, are shown in the following table:

| EXAMPLE | PARTIAL PRESSURE Ar (Pascal) | PARTIAL PRESSURE O2 (Pascal) | BIAS | AVERAGE FRICTION COEFFICIENT (After 30,000 cycles) | GRAIN SIZE (nm) | VOID CONTENT |
|---|---|---|---|---|---|---|
| I | 0.5 | 0.04 | Target Only | 0.84 | 20–35 | 2% |
| II | 0.5 | 0.02 | Target Only | 0.85 | 20–35 | 2% |
| III | 0.5 | 0.01 | Target Only | 0.48 | 20–40 | 2% |
| IV | 0.5 | 0 | Target Only | 0.53 | 20–45 | 3% |
| V | 2.0 | 0.01 | Target Only | * | 10–45 | 10–20% |
| VI | 2.0 | 0.04 | Target and Substrate | * | 10–40 | 10–20% |
| VII | 2.0 | 0.02 | Target and Substrate | * | 10–40 | 10–20% |

*Crashed during testing.

Oxygen passivation proved to be an important step, as disks not subject to oxygen passivation usually crashed during CSS testing. Apart from the table above, a general result of the testing was that superior wear results were obtained when the freshly deposited chromium underlayer was briefly passivated in an oxygen atmosphere, at a pressure of 0.04 Pa, just prior to overcoat deposition. From the table, it is apparent that increased argon pressure during overcoat sputtering degrades the tribological qualities of the overcoat, in that the void content increases. Higher void content in the cover layer reduces film density and micro-hardness. Higher argon pressures also were found to increase the tensile stress in the cover layer. While a slight oxygen pressure during overcoat deposition (particularly 0.01 Pa) improved surface qualities, too high an oxygen partial pressure degraded performance, and was observed to cause small (30 angstrom) voids in the cover layer. These voids reduced overcoat density.

Yet another result observed from this testing is that a substantial reduction in friction is achieved by applying a fluorocarbon lubricant to the partially stabilized zirconia overcoat. The results in the table above reflect the absence of a lubricant. In FIG. 6, however, lubricated and unlubricated sample results are indicated at 94 and 96, respectively. The results are shown for samples in which the overcoats were deposited at an argon pressure of 0.5 Pa, and an oxygen pressure of 0.02 Pa. The lubricant employed in the test is available from Montedison, and is identified as AM-2001. The unlubricated samples exhibited an average coefficient of friction below 0.9, stabilizing at just below 0.9 at about 16,000 CSS cycles. The lubricated surfaces show substantially improved average coefficients, remaining well below 0.5, even above 30,000 cycles. It was further observed that the deviation in specific coefficients from the average values was substantially reduced in the case of lubricated samples.

Thus, in accordance with the present invention, proper control of the argon or other inert gas pressure during a reactive cover layer deposition process, control of oxygen background pressure during such deposition, and a brief passivation of the magnetic thin film layer just prior to overcoat deposition, improve the wear and friction characteristics of overcoats composed of partially stabilized zirconia or hafnia. Furthermore, with the improved adhesion achieved due to oxygen passivation, no intermediate layer need be deposited onto the magnetic thin film prior to overcoat deposition, reducing the cost of manufacturing the recording media, as well as permitting closer transducing head proximity to the magnetic thin film for a given flying height.

What is claimed is:
1. A process for manufacturing a magnetic recording medium, including the steps of:
   depositing a crystalline underlayer onto a substantially planar surface of a substrate;
   depositing a crystalline recording layer comprised of a magnetic recording material onto the crystalline underlayer;
   passivating the exposed surfaces of the magnetic recording layer in an oxygen atmosphere for a period of less than fifteen minutes;
   following passivation, enclosing the substrate, underlayer and magnetic recording layer, and a target formed of a cover layer material, within a vacuum deposition chamber in a substantially inert gas atmosphere at a pressure in the range of from about one millitorr to about ten millitorr, to sputter deposit a protective cover layer onto the magnetic recording layer, to a thickness within the range of from about 250 angstroms to about 350 angstroms, said cover layer consisting essentially of one or both of the following constituents: partially stabilized zirconia, and partially stabilized hafnia.

2. The process of claim 1 wherein:
   said target consists essentially of from 85 percent to 98 percent of either hafnia or zirconia, and from 2 percent to 15 percent of a stabilizer, said stabilizer consisting essentially of a rare earth oxide.

3. The process of claim 2 wherein:
said stabilizer is one of the following: yttrium oxide ($Y_2O_3$), calcium oxide (CaO), or magnesium oxide (MgO).

4. The process of claim 3 wherein:
the step including sputter depositing the cover layer further includes depositing the layer to a thickness of about 300 angstroms.

5. The process of claim 1 wherein:
the step that includes sputter depositing the cover layer further includes applying a negative RF bias to said substrate.

6. The process of claim 5 wherein:
said negative RF bias is within the range of 50 to 250 volts.

7. The process of claim 6 wherein:
the step that includes sputter depositing said cover layer further includes applying a negative bias to said target.

8. The process of claim 1 wherein:
said passivation step includes maintaining said substrate, underlayer and recording layer in an atmosphere of oxygen at a pressure in the range of from about 0.05 millitorr to about 1 millitorr.

9. The process of claim 8 wherein:
the pressure of said oxygen is from about 0.01 to about 0.3 millitorr.

10. The process of claim 8 wherein:
said passivation step includes maintaining the substrate, underlayer and recording layer in said oxygen atmosphere for a period of from one-half minute to five minutes.

11. The process of claim 10 wherein:
said substrate, underlayer and recording layer are maintained in the oxygen atmosphere for approximately two minutes.

12. The process of claim 1 wherein:
the step of including sputter depositing the cover layer includes RF reactive sputtering in an atmosphere of argon and oxygen.

13. The process of claim 1 wherein:
said step including sputter depositing the cover layer includes RF reactive sputtering in an atmosphere including said inert gas and oxygen, with said oxygen having a partial pressure of at most 0.02 Pa (0.15 mtorr).

14. The process of claim 13 wherein:
said partial pressure of the oxygen is less than 0.01 Pa (0.077 mtorr), and said inert gas is argon.

15. The process of claim 14 wherein:
said substrate is preheated to a temperature in the range of from 120 to 230 degrees centigrade, prior to depositing the crystalline underlayer.

16. The process of claim 1 further including:
preheating the substrate, underlayer and thin film layer to a temperature in the range of from 120° C. to 230° C. just prior to sputter depositing said cover layer.

17. A process for forming a protective cover layer over a magnetic recording medium, including the steps of:
enclosing a magnetic recording medium, including at least a substrate and a magnetic thin film recording layer deposited on the substrate, along with a target consisting of a cover layer material, within a vacuum deposition chamber in an inert gas atmosphere at a pressure in the range of from one millitorr to ten millitorr, said atmosphere further including oxygen at a partial pressure of at most 0.15 millitorr, to deposit a protective cover layer of said cover layer material by RF reactive sputtering onto said magnetic thin film recording layer, to a thickness within the range of from about 250 angstroms to about 350 angstroms, said cover layer material consisting essentially of one or both of the following constituents: partially stabilized zirconia, and partially stabilized hafnia.

18. The process of claim 17 wherein:
the partial pressure of said oxygen is maintained at approximately 0.08 millitorr.

19. The process of claim 18 wherein:
said inert gas is argon.

20. The process of claim 17 further including:
prior to depositing the cover layer, passivating the magnetic thin film recording medium in an atmosphere of oxygen for a period of less than fifteen minutes.

21. The process of claim 20 wherein:
said passivation step includes maintaining the oxygen at a pressure within the range of from about 0.05 millitorr to about 1 millitorr.

22. The process of claim 21 wherein:
the step of passivation includes maintaining the oxygen at a pressure of 0.1 to 0.3 millitorr.

23. The process of claim 20 wherein:
said passivation step includes maintaining the recording medium in the oxygen atmosphere for a time period within the range of from one to five minutes.

24. The process of claim 23 wherein:
said time period is approximately two minutes.

25. The process of claim 20 wherein:
said substrate is formed of aluminum coated with a nickel-phosphorous layer, and said cover layer material includes from 85 to 98 percent of either hafnia or zirconia, and from 2 to 15 percent of a stabilizer consisting essentially of a rare earth oxide.

26. The process of claim 25 wherein:
said stabilizer consists of yttrium oxide ($Y_2O_3$).

27. The process of claim 17 wherein:
said step including the sputter depositing of the cover layer further includes applying an RF negative bias to said recording medium.

28. The process of claim 27 wherein:
said RF power is within the range of from 200 to 1,000 kw.

29. The process of claim 27 wherein:
said step including sputter depositing the cover layer further includes applying a negative bias to said target.

* * * * *

UNITED STATES PATENT AND TRADEMARK OFFICE
CERTIFICATE OF CORRECTION

PATENT NO. : 5,078,846

DATED : January 7, 1992

INVENTOR(S) : Miller et al

It is certified that error appears in the above-identified patent and that said Letters Patent is hereby corrected as shown below:

Claim 9, Column 11, Line 30, please delete "0.01" and put instead -- 0.1 --.

Signed and Sealed this

Twentieth Day of April, 1993

Attest:

MICHAEL K. KIRK

*Attesting Officer*  *Acting Commissioner of Patents and Trademarks*